(12) United States Patent
Kleinecke et al.

(10) Patent No.: US 7,432,819 B2
(45) Date of Patent: Oct. 7, 2008

(54) APPARATUS FOR CONTINUOUS COOLING OF ELECTRICAL POWERED EQUIPMENT

(75) Inventors: John D. Kleinecke, Houston, TX (US); Todd A. Willhoit, Katy, TX (US); John T. Kelley, Houston, TX (US)

(73) Assignee: Toshiba International Corporation, Houston, TX (US)

( * ) Notice: Subject to any disclaimer, the term of this patent is extended or adjusted under 35 U.S.C. 154(b) by 609 days.

(21) Appl. No.: 11/192,369

(22) Filed: Jul. 29, 2005

(65) Prior Publication Data

US 2005/0252672 A1      Nov. 17, 2005

Related U.S. Application Data

(62) Division of application No. 10/683,159, filed on Oct. 14, 2003, now Pat. No. 6,936,767.

(51) Int. Cl.
    *G08B 21/00* (2006.01)
(52) U.S. Cl. ............... 340/679; 174/15.1; 174/17 VA; 361/274.1; 361/676; 361/688; 361/694
(58) Field of Classification Search ............... 340/679; 174/15.1, 17 VA; 361/274.1, 274.2, 605, 361/676–678, 688–690, 694–695
    See application file for complete search history.

(56) References Cited

U.S. PATENT DOCUMENTS

| | | | |
|---|---|---|---|
| 4,967,155 A | 10/1990 | Magnuson | |
| 5,773,755 A | 6/1998 | Iwatare | |
| 6,256,203 B1 * | 7/2001 | Ingraham et al. | 361/720 |
| 6,364,761 B1 * | 4/2002 | Steinbrecher | 361/695 |
| 6,483,699 B1 * | 11/2002 | Salmonson et al. | 361/687 |
| 6,579,168 B1 * | 6/2003 | Webster et al. | 361/687 |
| 6,590,769 B2 * | 7/2003 | Hilpert et al. | 361/695 |
| 6,646,877 B2 | 11/2003 | Willers et al. | |
| 2005/0030712 A1 * | 2/2005 | Faneuf et al. | 361/687 |

* cited by examiner

*Primary Examiner*—George A Bugg
*Assistant Examiner*—Samuel J Walk
(74) *Attorney, Agent, or Firm*—Banner & Witcoff, Ltd.

(57) ABSTRACT

A fluidic cooling assembly for removing heat from electrical equipment includes operational diversity features in which multiple fluid moving devices are mounted in a single housing. The assembly may include a first fluid baffle and a second fluid baffle disposed within the housing so as to define a first and a second control compartment. A first fan and a second fan may be disposed within the first control compartment and the second control compartment, respectively. A first sensor and a second sensor may be configured to sense changes in operation of the first fluid moving device and the second fluid moving device, respectively; and a controller unit configured for receiving signals generated by the first sensor and the second sensor go as to the transmit control signals to the first fan and the second fan.

5 Claims, 9 Drawing Sheets

APPARATUS FOR CONTINUOUS COOLING OF ELECTRICAL POWERED EQUIPMENT

CROSS-REFERENCE TO RELATED APPLICATIONS

This application is a divisional application of U.S. patent application Ser. No. 10/683,159 filed Oct. 14, 2003 which is hereby incorporated by reference.

FIELD OF THE INVENTION

Aspects of the present invention are directed generally to an apparatus and method for fluidic cooling of electrical powered equipment. More particularly, aspects of the present invention relates to a fan assembly and method for cooling an electrical power conversion unit.

BACKGROUND OF THE INVENTION

Large power conversion apparatus, such as medium voltage drives, become hot during operation, and consequently the heat needs to be removed to keep the apparatus from overheating. Overheating can cause significant damage to the conversion apparatus. Transformers, rectifiers and power switching devices generate heat. Some systems have a fan to help remove the heat. In the case of a failure of the fan in conventional systems, the power conversion apparatus must be shut down before overheating occurs. It may take many hours and numerous personnel to determine what kind of failure occurred. This is important when considering the complex electrical system the potential for loss of electrical power for business critical systems and residences.

In view of the foregoing problems, there is a need for an improved system and method of cooling electrical powered equipment.

SUMMARY OF THE INVENTION

Features of the present invention generally relate to a diversity system and method of fluidic cooling of electrical powered equipment.

Aspects of the present invention provide the capability of continuously cooling powered equipment to recover quickly from a natural or man-made disaster. A diversity system and method of present invention reduces single points of failures within subject equipment to provide uninterrupted operations. Thus, features of the present invention reduce damage to powered equipment and reduce operational cost.

In one aspect of the present invention, a fluidic cooling assembly for removing heat from electrical equipment includes operational diversity features in which multiple fluidic moving devices mounted within an enclosure. The fluidic cooling assembly may include a first baffle and a second baffle disposed within the enclosure so as to define a first and a second control compartment. A first fluidic moving device and a second fluidic moving device may be disposed within the first control compartment and the second control compartment, respectively. A first sensor and a second sensor may be configured to sense changes in operation of the first fluidic moving device and the second fluidic moving device, respectively. A controller unit may be configured for receiving signals generated by the first sensor and the second sensor and transmitting control signals to control operation of the first fluidic and the second fluidic moving devices.

In yet another aspect, the first sensor and the second sensor may be configured to respond to a change in fluid pressure generated by the first fluidic moving device and the second fluidic moving device. In one aspect, the first sensor and the second sensor may be configured to respond to a negative fluid pressure change generated by the corresponding first fluidic moving device and the second fluidic moving device. In a further aspect, the first sensor and the second sensor may be configured to respond to a positive fluid pressure change generated by the corresponding first fluidic moving device and the second fluidic moving device. In another aspect, the first sensor and the second sensor may be configured to respond to a change in position of the corresponding first baffle and the second baffle, respectively.

In another aspect of the present invention, a fan assembly for removing heat from electrical equipment. A first air baffle and a second air baffle disposed within the housing defining a first control compartment and a second control compartment, the air baffles being pivotally attached to the housing; a first fan unit and a second fan unit disposed within each of the respective control compartment. A first sensor and a second sensor responsive to the movement of the first air baffle and the second air baffle from a control position, respectively. A controller unit configured for receiving signals generated by the first sensor and the second sensor and for transmitting control signals to control operation of the first fan unit and the second fan unit.

In another aspect on the present invention, a computer implemented method of continuous cooling of the electrical equipment is provided for a fan assembly including a first air baffle and a second air baffle disposed within a housing defining a first control compartment and a second control compartment, the air baffles being pivotally operable and a first air moving device and a second air moving device disposed within each of the respective control compartment. In the method a controller receives a baffle_absence signal responsive to the movement of the first air baffle from an in_use position; and responsive to receiving the baffle_absence signal, the controller unit operates the second air moving device. In this way, a fan assembly for removing heat from electrical equipment includes operational diversity features which multiple air moving devices. When any one of the air moving devices, such as fans, is energized, heated equipment air is drawn into the fan housing and exhausted from away. Upon unexpected operational change of either a primary impeller or a secondary impeller of an air moving device, a sensor signals a programmable controller to switch operation to the other functioning impeller.

In another aspect on the present invention, a computer implemented method of continuous cooling of the electrical equipment is provided for a fan assembly including a first air baffle and a second air baffle disposed within a housing defining a first control compartment and a second control compartment, the air baffles being pivotally operable and a first air moving device and a second air moving device disposed within each of the respective control compartment. In the method, a controller unit receives a signal responsive to a loss of air pressure from the first air moving device; and responsive to receiving the signal, the controller unit operating the second air moving device. Upon unexpected air flow loss from either a primary impeller or a secondary impeller of an air moving device, a sensor signals a programmable controller to switch operation to the other functioning impeller.

In another aspect, an articulated air baffling system includes movable baffles. These movable baffles serve to isolate the non-running motor/impeller from the air flow path, thus preventing any unwanted air recirculation which would reduce the overall cooling efficiency.

In yet another aspect, a programmable controller periodically cycles motor/impeller system operation between a primary impeller and a secondary impeller to ensure that both systems are always operational. By switching between primary and secondary operation periodically during normal operation, it is assured that one motor/impeller will always be functional should a failure of the other occur at some point.

The above and other aspects, features and advantages of the present invention will be readily apparent and fully understood from the following detailed description of preferred embodiments, taken in connection with the appended drawings which are included by way of example, and not by way of limitation with regard to the claimed invention.

DETAILED DESCRIPTION OF THE PREFERRED EMBODIMENTS

The following detailed description is divided into subsections to assist the reader. The sub-sections include: Overview; Illustrative Fan Assembly; Illustrative Controller; and Control Process.

Overview

FIGS. 1-11 illustrate a system and method for fluidic cooling of electrical powered equipment according to one or more features of the present invention. The term "fluidic cooling" pertains to removing heat by way of a dynamical fluid, such as air or other gas. In one aspect, the present invention provides the capability for continuously cooling powered equipment to recover quickly from a natural, man-made disaster, or other failure. In one aspect, autonomous control operations provided by the present invention allows for efficient operations to significantly reduce operational costs and prevent equipment damage. Reliance on standby maintenance support personnel for installation of cooling systems are eliminated with the continuity tools and systems of the present invention over traditional methods and systems.

Illustrative Fan Assembly

Figure 1:
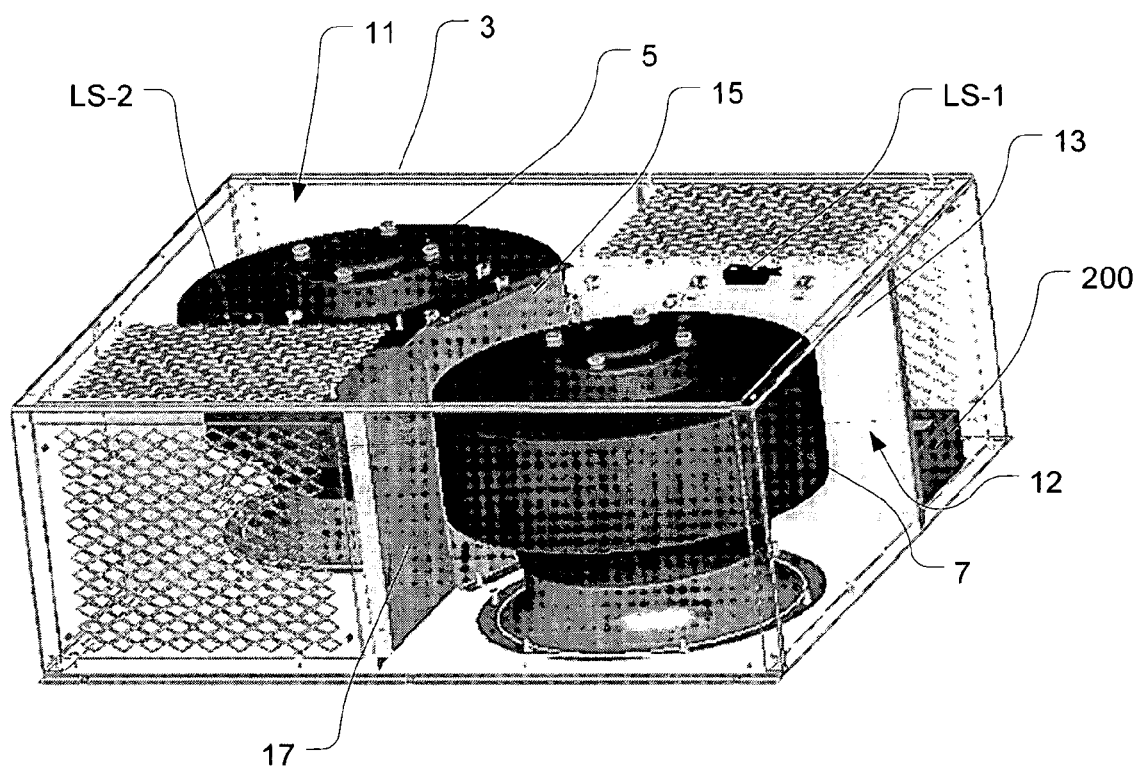
FIG. 1 is a perspective view of a fan assembly with sidewalls removed to reveal interior components therein.
Figure 2:
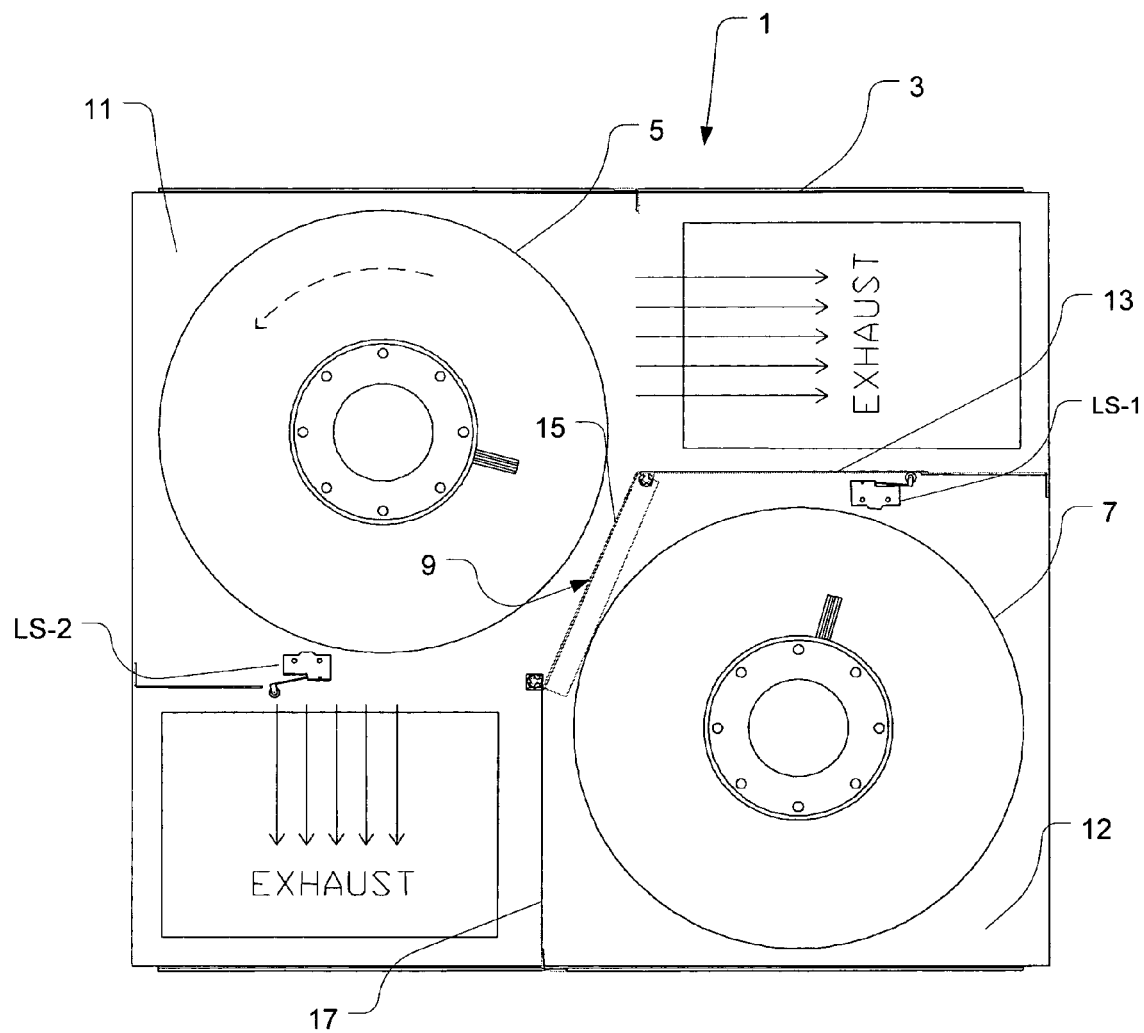
FIG. 2 is a schematic diagram of a fan assembly system of FIG. 1 that can be used to implement various aspects of the invention.

Referring to FIGS. 1 and 2, a fan assembly 1 comprises an outer housing 3 including a plurality of air moving devices—a first fan unit 5 and a second fan unit 7. As used herein the terms "first" and "second" are used for ease of explanation and are not intended to be limiting the scope of the present invention. The housing 3 may be formed of an appropriate shape and gauge of non-conductive material, though other materials can also be used, such as metals or plastics. The thickness of the housing material should be sufficient to withstand the air pressure generated by the fan units.

Figure 3:
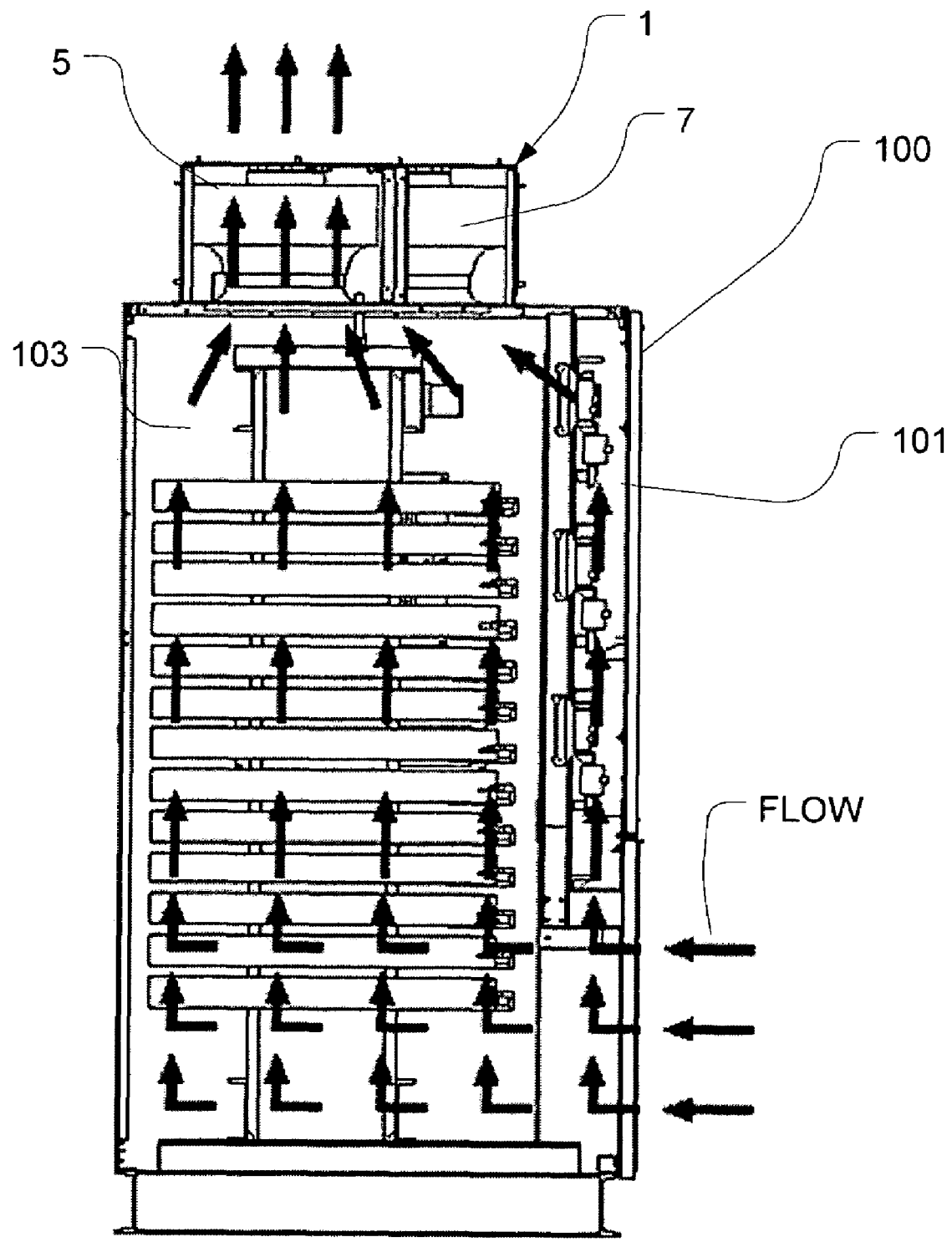
FIG. 3 is a schematic representation of the fan assembly of FIG. 1 in one operating mode illustrating air flow cooling pathways within power conversion apparatus.
Figure 4:
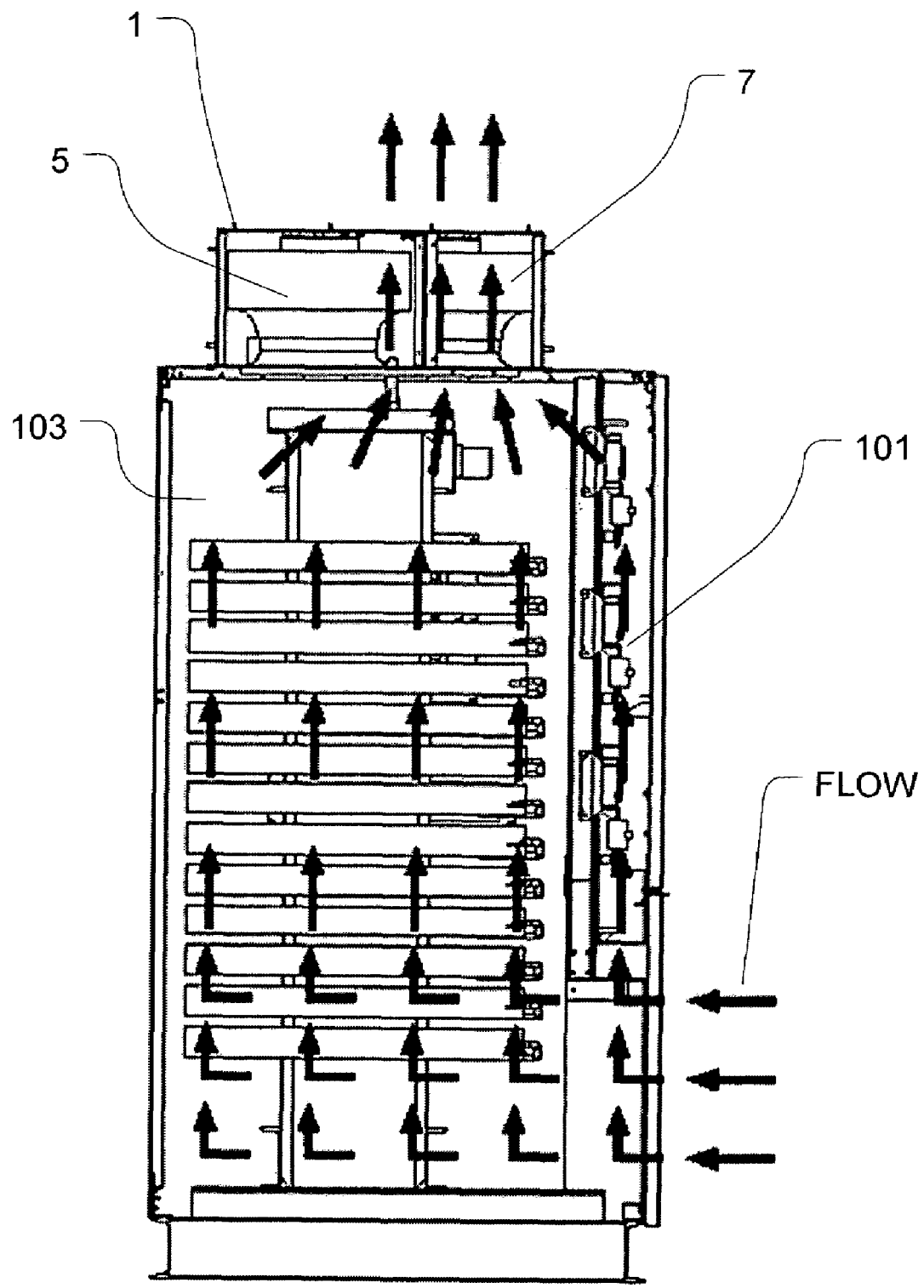
FIG. 4 is a schematic representation of the fan assembly of FIG. 1 in another operating mode illustrating air flow cooling pathways within power conversion apparatus.

FIGS. 3 and 4 are schematic diagrams of the fan assembly 1 in cooling operating modes according to the present invention. In one cooling method, heated equipment air is drawn from the powered equipment 100 and exhausted therefrom into ambient air or ductwork (not shown) during operating of the first fan unit 5 or the second fan unit 7. The terms "powered equipment" is not intended to be limiting but is used for ease of explanation to denote power conversion apparatus, such as medium voltage drives. Nonetheless, this method provides for continuous convective cooling of the powered equipment. In one operating mode shown in FIGS. 3 and 10, first fan unit 5 is operating so as to draw air from the exterior of the powered equipment 100 through various cooling pathways within the equipment and discharge the heated air into the ambient or ductwork. In this operating mode second fan unit 7 is stopped so that fan unit 5 draws all the air for cooling the powered equipment 100.

Figure 11:
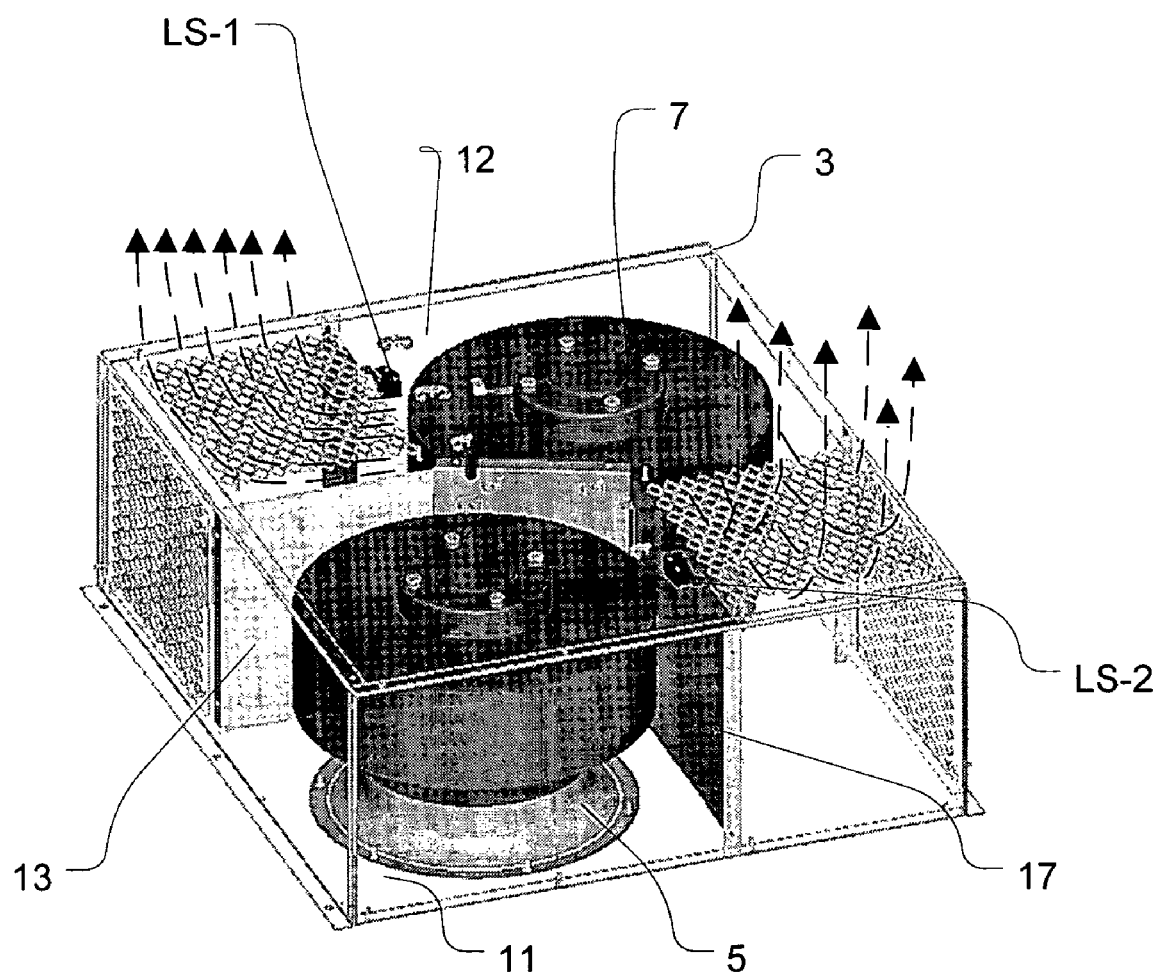
FIG. 11 is a perspective view similar to FIG. 1 of the fan assembly illustrating another cooling operating mode thereof.

In an alternative operating mode shown in FIGS. 4 and 11, first fan unit 5 may be stopped so that second fan unit 7 draws all the air for cooling the powered equipment. In a ducted construction, the ductwork may be formed of any appropriate shape and gauge galvanized steel. Nevertheless, other materials may be used, such as other metals or plastics. The thickness of the material should be sufficient to withstand the air pressure within the ductwork.

With reference to FIGS. 1 and 2, in one construction, first fan unit 5 and second fan unit 7 have substantially the same features and air flow characteristics. For ease of explanation, the description will focus on the construction of one fan unit, e.g., fan unit 5. Nevertheless, the fan units 5 and 7 can be of a different construction and air flow characteristics to fine tune the cooling performance of the fan assembly 1 for a particular performance level. Fan unit 5 may be of any conventional construction, either directly or indirectly driven. Fan unit 5 may comprise an electrical motor operatively coupled to a shaft with an impeller disposed within a fan unit enclosure. The fan unit enclosure includes an air intake and an opposing air outlet for air to flow through the fan unit. In one construction, the air that flows though the fan unit may be heated air emanating from the powered equipment. In another construction, the air may be ambient air entering the equipment.

The fan unit 5 produces a volume and velocity of air sufficient to draw heated air from powered electrical equipment via the air intake and discharge the heated air through the air outlet. Fan unit 5 operates so that when the motor is energized, the impeller rotates with the shaft to draw in the heated air accordingly. Nevertheless, fan unit 5 may include a sufficient power rating and a rated air volume flow speed (cubic feet per minute or liters per second) to discharge the heated air into the appropriate ductwork away from the powered equipment being cooled. In an alternative construction, nevertheless, the fan unit 5 does not need a fan unit enclosure for operation. The air intake and air outlet can be formed as part of the outer housing 3 of fan assembly 1. This alternative construction provides for reduced manufacturing cost of the fan assembly.

With reference to FIG. 2, the first fan unit 5 and the second fan unit 7 each may be configured to coordinate operation with an articulated air baffling system 9. Advantageously, the air baffling system 9 provides for continuous fluidic cooling of powered equipment, such as medium voltage drives and other similar large power conversion apparatus. The air baffling system 9 includes a first movable air baffle 13 attached by a hinge to the first end of a fixed position air baffle 15. A second movable air baffle 17 is attached, also by a hinge, to the second end of the fixed air baffle 15. The hinge can be of a conventional construction to allow pivotable movement of the baffles, 13, 17. Air baffle 13 and air baffle 17 are attached to the fixed position air baffle 15 so as to freely pivot into and out of positions. This pivoting can be used for signaling and/or air flow control. First fan unit 5 and second fan unit 7 may be disposed within air control compartments 11 and 12. Air control compartments 11, 12 are defined by the air baffling system 9 and housing 3 so as to provide continuous cooling of power equipment.

With continued reference to FIGS. 1 and 2, fan assembly 1 may include a plurality of sensing devices LS-1, LS-2 configured to indicate operational changes with respect to each of the first fan unit 5 and second fan unit 7. In one aspect, this feature allows the sensing device LS-1 and sensing device LS-2 to send an electrical signal to a programmable controller 200 (shown in FIG. 5) so as to transfer operation between the fan units for continuously cooling powered equipment. In one construction, sensing device LS-1 and sensing device LS-2 may be configured to indicate air pressure changes to a threshold level associated with air control compartments 11 and 12. In one construction, sensing devices LS-1, LS-2 may be located in a positive pressure region of an air stream on the outlet or exhaust side of the fan units. In such a construction, sensing devices LS-1, LS-2 may be configured to indicate a reduction in positive air pressure in one of the air control compartments 11 and 12.

In another construction, sensing devices LS-1, LS-2 can be disposed in a negative pressure region of an air stream on the inlet side of the fan units. In such a construction, sensing device LS-1, LS-2 maybe configured to indicate a decrease in negative air pressure. In another construction, sensing devices LS-1, LS-2 may be provided as limit switches configured to abut the respective movable air baffle 13, 17. Alternatively, the sensing device LS-1 and sensing device LS-2 may be configured for binary operation to send state signals to the controller 200. In an alternative arrangement in lieu of limit switches, sensing devices may be air flow switches configured to sense or measure air speed or pressure within the air control compartment 11 and 12. Nevertheless, other types of sensing devices may be used, such as contact sensors, or sensors that detect the position of the moveable air baffles 13, 17, such as rotary encoders.

Illustrative Controller Environment

Figure 5:
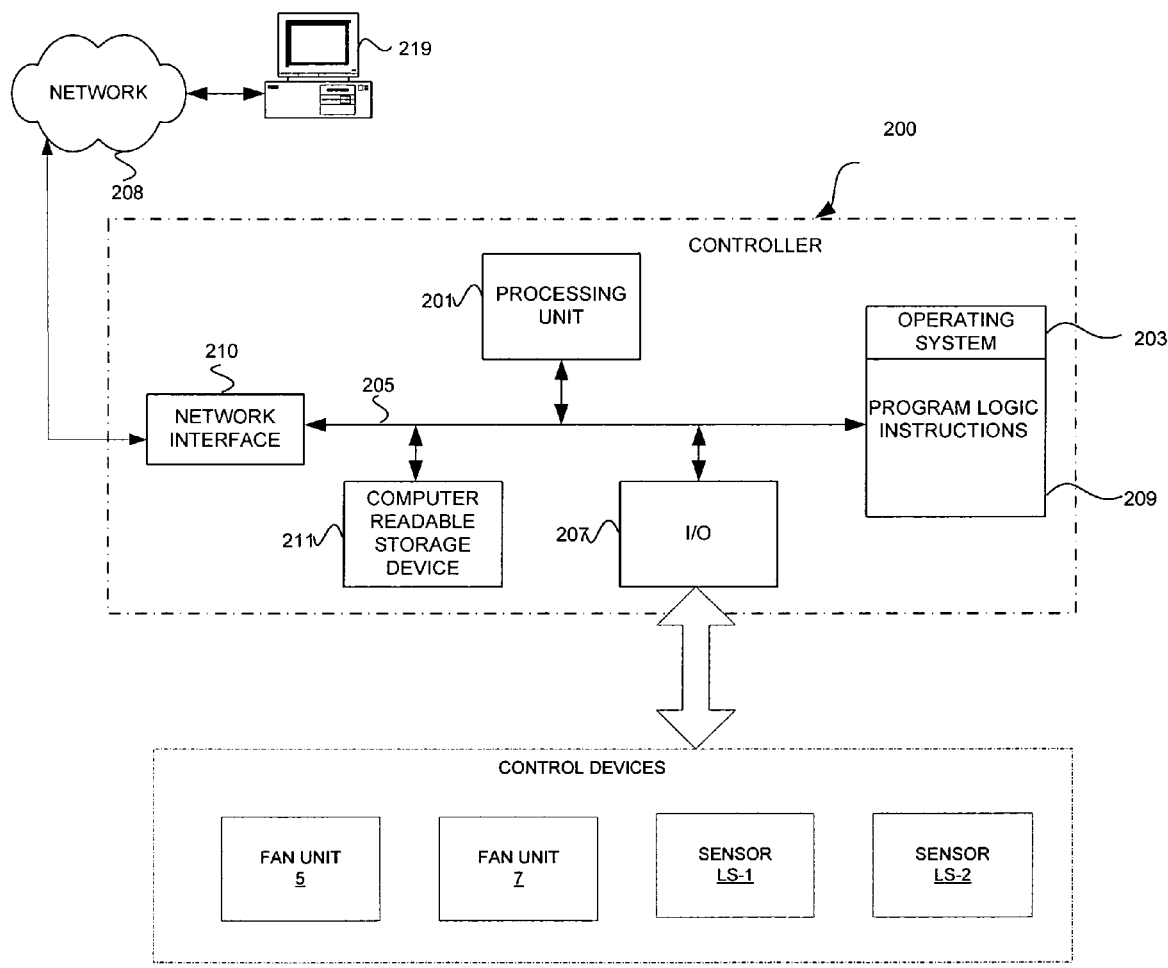
FIG. 5 is a schematic representation of a general-purpose computing environment that can be used to implement various aspects of the invention.

Referring to FIG. 5, a microprocessor controller 200 may includes a computing device for controlling the operation of fan assembly 1. In one construction, controller 200 comprises a programmable logic controller. Likewise, in another construction, controller unit 200 may have aspects of a general purpose computer configured to operate with such programmable logic controllers. In one programmed arrangement, controller unit 200 periodically time cycles the operation of the fan units between the first fan unit 5 and the second fan unit 7 to test system continuity of operation. In another programmed arrangement, sensing device LS-1 or sensing device LS-2 signals the programmable controller 200 upon unexpected airflow loss from either the first fan unit 5 or the second fan unit 7. The programmable controller 200 then transfers operation to the other operational fan unit. Advantageously, service and business operations are reliably maintained and equipment is continuously cooled without downtime and significant cost penalties.

One type of suitable programmable controller may be obtained from Toshiba model number TDR116S6C. Nevertheless, other similar programmable controllers may be used with the fan assembly 1. Hardware components of microprocessor controller 200 may include a processing unit 201, a system memory 203, and a system backplane 205 that forms a data pathway for input/output interface 207. Input/output interface 207 communicates with various control devices, such as fan unit 5 and fan unit 7, the sensing device LS-1 and sensing device LS-2. Processing unit 201 may be a suitable microprocessor used in industrial control systems. System backplane 205 may be any of several types of conventional backplane structures. System memory 203 includes computer readable code in the form of read only memory (ROM) and random access memory (RAM). System memory 203 stores programmable instructions of the operational logic sequences 209 that are executed by processing unit 201.

Controller unit 200 may further include a computer readable storage device 211 that may comprise an Eraseable Programmable Read Only Memory (EPROM), Electrically Eraseable Programmable Read Only Memory (EEPROM), or battery backed-up RAM. Storage device 211 and associated computer-readable media provide nonvolatile storage of computer readable code and operational logic sequences 209. Nevertheless, those having ordinary skill in the art can readily program the operational logic sequences for air control system. In a further arrangement, programmable controller 200 may operate in a networked environment 208 using a network interface 210. The networked environment may include a local area network (LAN) any number of networking signaling used in conventional industrial control systems.

Illustrative Control Process/Sequences

With reference to FIG. 5, a control operation provided by the present invention allows efficient operations to significantly reduce operational costs and continuously cool equipment. To facilitate these beneficial and novel features, the present invention provides novel computer implemented operation for the fan assembly 1. Operational logic may be described in the general context of computer-executable instructions, such as program modules, executed by one or more computing devices, such as programmable controller 200. Generally, program modules may include routines, programs, objects, components, data structures, or ladder logic that perform particular tasks or implement particular data types.

In one example configuration, sensing devices LS-1 and LS-2 may be configured to detect the presence or absence of the first movable air baffle 13 or the second moveable air baffle 17 with respect to a predetermined in-use position. The predetermined in-use position is associated with the running of the first fan unit 5 and the second fan unit 7 to isolate the non-running fan unit from the air flow path. In one arrangement, a baffle_presence signal is generated when the movable air baffles 13, 17 have reached their predetermined in-use position. The baffle_presence signal is transmitted to the controller 200 so as to indicate the respective fan unit 5 or fan unit 7 is running. During operation of the fan units 5 and 7, a baffle_absence signal is generated when movable air baffles 13 and 17 move out of the in-use position. The controller 200 receives this baffle_absence signal to indicate a loss of airflow in the respective the air control compartment 11 and 12. In another example configuration, the baffle_absence signal may be interpreted as a reduction in air pressure to a threshold level which indicates that the first fan unit 5 or second fan unit 7 has loss operation or air flow. Hence, two movable air baffles may serve to isolate the non-running fan unit from the air flow path. Advantageously, this isolation arrangement prevents undesirable air recirculation within the fan assembly 1 so that more heated air is transferred away from the powered equipment. Thus, the arrangement enhances the overall cooling efficiency.

In an alternative configuration, programmable controller 200 may be configured to monitor the electrical power being fed to the first fan unit 5 and the second fan unit 7. This monitoring function enables the controller 200 is perform a check to determine if there was an unexpected loss of air flow. In this configuration, the operation is transferred to the other working fan unit.

Fan assembly 1 may be configured with an operative connection to an internet protocol (IP) network 208 which enables access for devices on the World Wide Web to provide provisioning and other features. In one arrangement, operating data may be viewed from a remote location using a computer terminal 219 running a conventional web browser. Alternatively, loss of air flow signals may be transferred in a control center.

Figure 6:
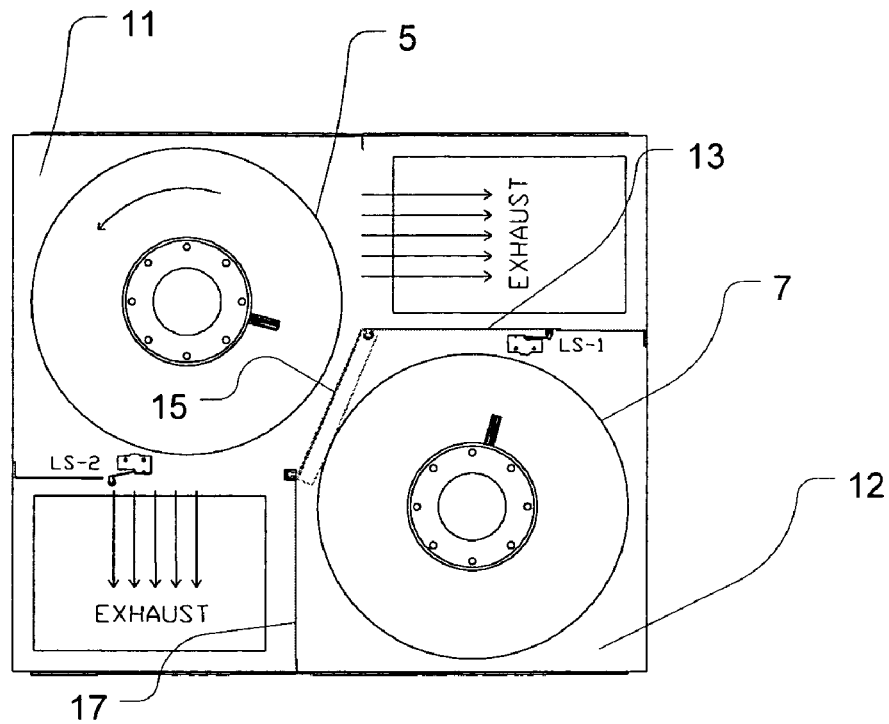
FIG. 6-FIG. 9 are schematic diagrams illustrating operational sequences according to one or more aspects of the present invention.

FIGS. 6-9 illustrate an operational sequence of a fan assembly according to one or more aspects of the present invention. The operational sequences provided herein are for illustration, but is not intend to limit other possible sequences. For example, FIGS. 6-9 illustrate a sequence of events that may occur during a failure of the first fan unit 5 and how the operational logic of controller 200 may operate. With reference to FIG. 6, the fan assembly 1 is shown in one operational state that includes the first fan unit 5 exhausting air from the powered equipment and the second fan unit 7 on standby. In this one operational state, air baffle 13 and air baffle 17 being hinged, have been pushed into the in-use positions shown by the air pressure arrows and the air exhausted into the rectangular areas shown. In a limit switch embodiment, air baffle 13 pushes against sensor LS-1 causing it to actuate, signal the programmable controller 200 that the first fan unit 5 is operational and delivering air flow.

Figure 7:
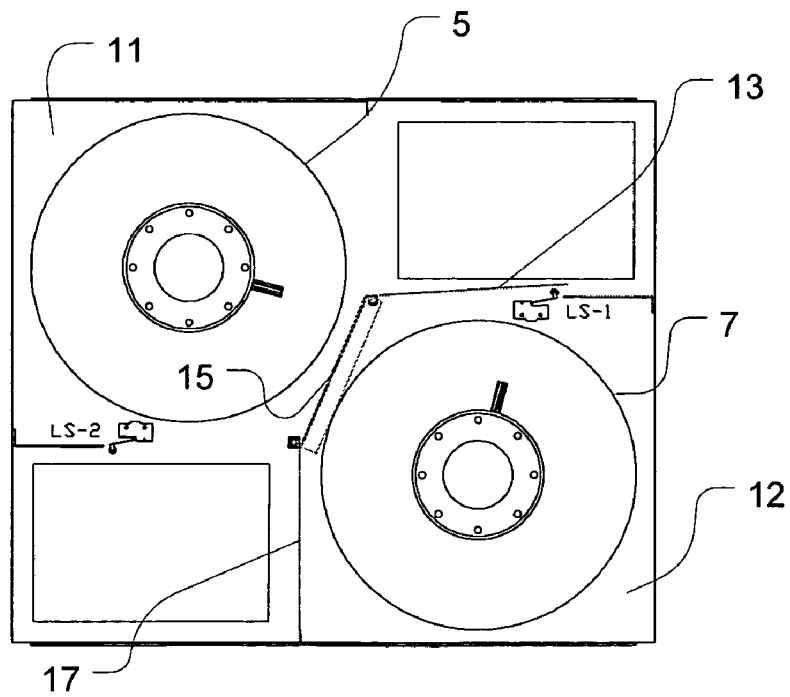

Referring to FIG. 7, the first fan unit 5 has unexpectedly stopped providing air flow, e.g., a change in operational state has occurred. The change in operational state can be, for example, a motor failure which causes a loss of air flow or loss of positive air pressure. In one example operation using sensor LS-1 and LS-2 as spring-loaded limit switches, the loss of air pressure causes the sensor LS-1 to push baffle 13 to open slightly. Thus, switch contacts on sensor LS-1 then opens and signals the programmable controller 200 that a fan fault has occurred. This fan fault could be the baffle-absence signal to indicate a loss of air flow in the respective the air control compartment 11.

Figure 8:
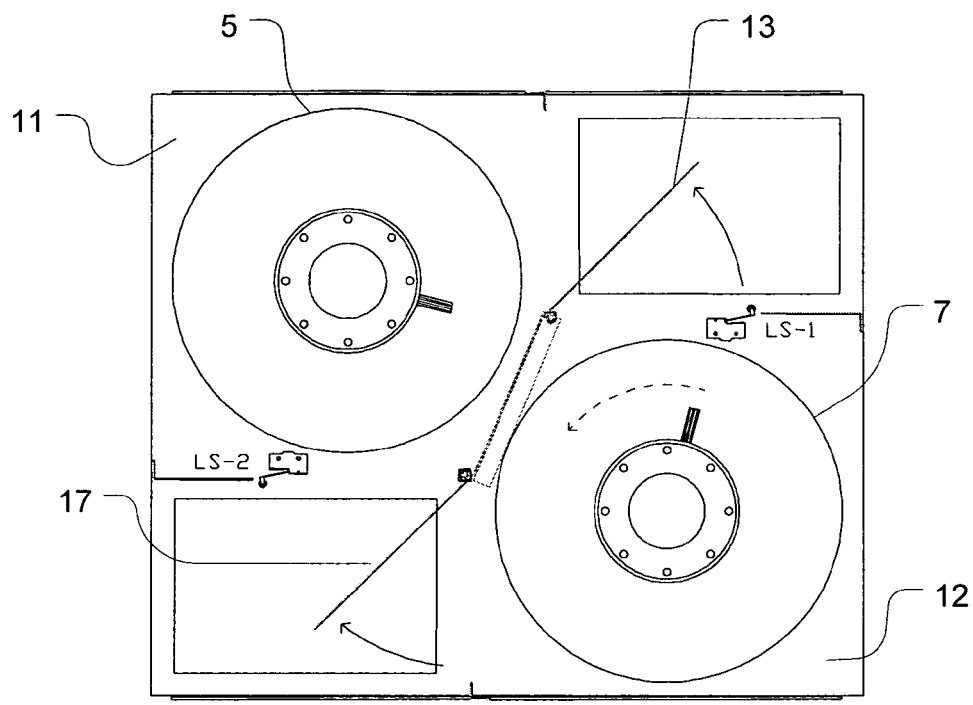
Figure 9:
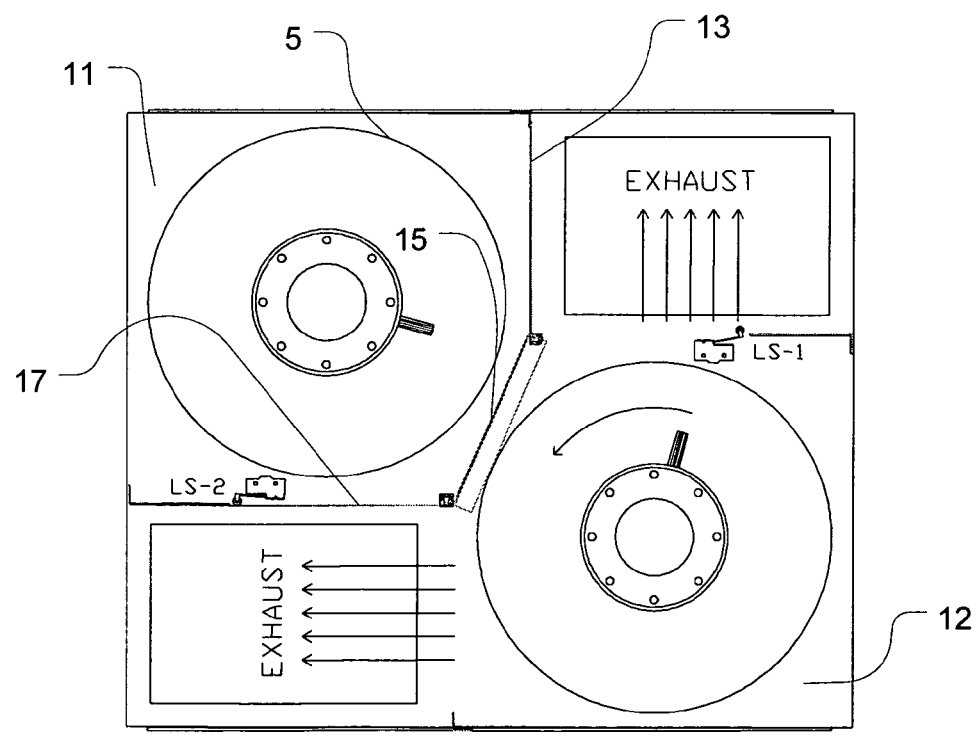

With reference to FIG. 8, the programmable controller 200 has transferred power to the second fan unit 7 and the fan unit impeller has started to come up to a desired rotational speed. At point some time point in the operation of the second fan unit 7, the two air baffles 13, 17 will begin to move in a direction away from the increasing air pressure to enclose air control compartment 12. In FIG. 9, the second fan unit 7 has reached the desired speed and both air baffles 13, 17 have moved into an "in-use" position. In one such "in-use" position the air baffles 13, 17 seal off the first fan unit 5. In the sequence, the second fan.7 has generated sufficient air pressure so that baffle 17 is in an abutment relation with sensor LS-2. This abutment relationship causes contacts on sensor LS-2 to actuate and transfer a signal the programmable controller 20. This signal could be a baffle_presence signal. In one case such a signal can be used to indicate that the second fan unit 7 has reached a desired speed or volume of airflow.

Other operational sequences are possible for fan assembly 1. In one operational sequence, the first fan unit 5 can be in a normal operational state similar to shown and described with respect to FIG. 6. In another operational state, air moving activities between the first fan unit 5 and second fan unit 7 can be controlled by programmable controller 200. In this operational sequence, programmable controller 200 may control the respectively speeds and volume flow rates of fan units 5 and 7 to coordinate a cyclic operation. For example, in FIG. 7, the motor driving the primary impeller of first fan unit 5 can de-energized by the programmable controller 200. While the first fan unit 4 is coming off-line and the impeller is spinning down to lose speed, the motor driving the secondary impeller of the second fan unit 7 can be energized to reach a desired speed. In this operational sequence, the two air baffles 13, 17 begin to move as a result of the increasing air pressure from the second fan unit 7, and decreasing air pressure of the first fan unit 5. In such a case of decreasing air pressure, sensor LS-1 is released by baffle 13 and may produce a baffle_absence signal for the programmable controller 200.

Nevertheless with respect to FIG. 9, fan assembly 1 is also shown in one operational state that includes the second fan unit 7 exhausting air from the powered equipment and the first fan unit 5 on standby. In this one operational state, air baffle 13 and air baffle 17 being hinged, have been pushed into the in-use positions shown by the air pressure arrows and the air exhausted into the outlet areas. In a limit switch embodiment, air baffle 17 pushes against sensor LS-2 causing it to actuate, signal the programmable controller 200 that the second fan unit 7 is operational and delivering air flow.

Summary

Figure 10:
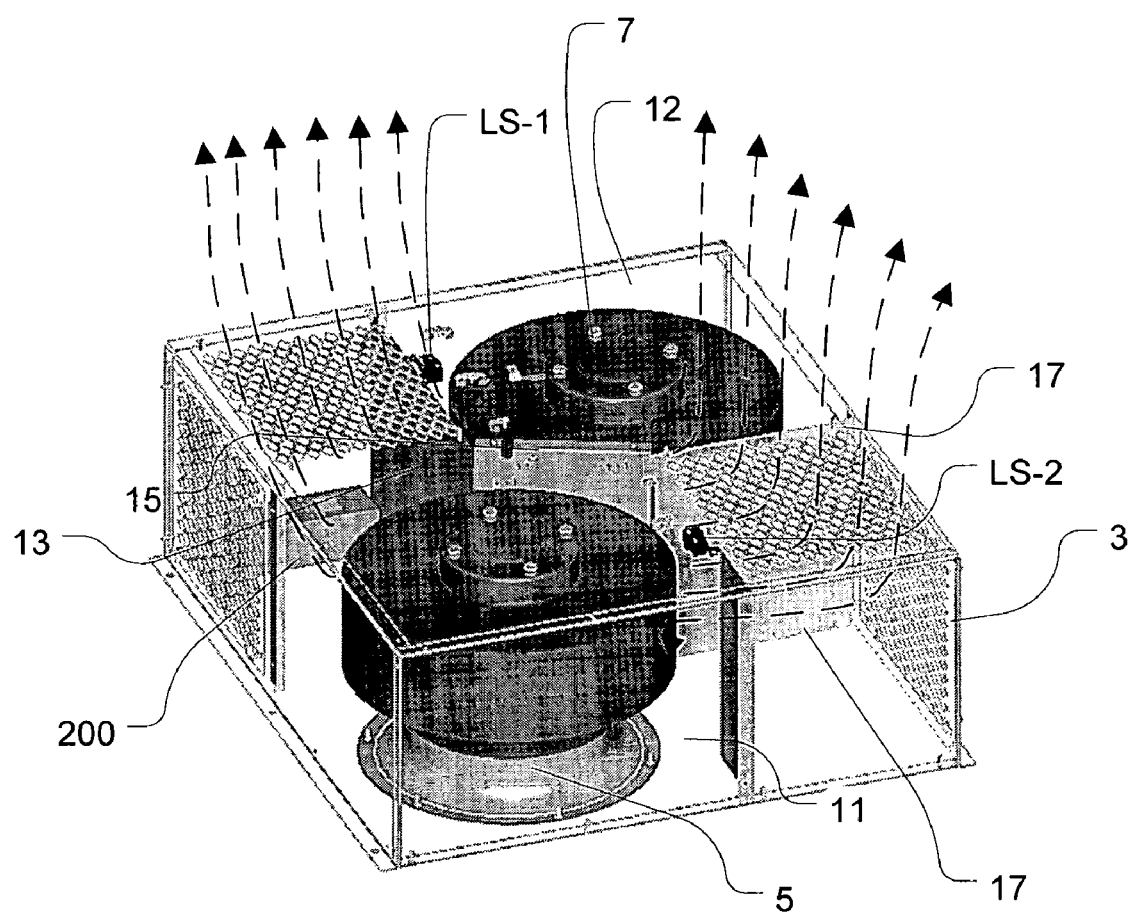
FIG. 10 is a perspective view similar to FIG. 1 of the fan assembly illustrating one cooling operating mode thereof.

Features of the present invention generally relate to a diversity system and method of fluidic cooling of electrical powered equipment. In one aspect, the present invention provides the capability of continuously cooling powered equipment to recover quickly from a natural or man-made disaster. In another aspect, a diversity system or method reduces single points of failures within a fan assembly to provide uninterrupted operations. Thus, features of the present invention reduce damage to powered equipment and reduce operational cost. There are several advantages of the arrangements described, including reduction in overall space for a fan assembly. During initial installation, fan enclosures required for the installation is reduced at a saving of nearly 50% over conventional systems. Further, as shown in FIGS. 10 and 11, air is always exhausted from the same opening, regardless of whether the first fan unit 5 or second fan unit 7 is operating, resulting in simplified exhaust ducting and reduced installation cost.

Although the invention has been defined using the appended claims, these claims are exemplary in that the invention may be intended to include the elements and steps described herein in any combination or sub combination. Accordingly, there are any number of alternative combinations for defining the invention, which incorporate one or more elements from the specification, including the description, claims, and drawings, in various combinations or sub combinations. It will be apparent to those skilled in the relevant technology, in light of the present specification, that alternate combinations of aspects of the invention, either alone or in combination with one or more elements or steps defined herein, may be utilized as modifications or alterations of the invention or as part of the invention. It may be intended that the written description of the invention contained herein covers all such modifications and alterations.

What is claimed is:

1. A computer implemented method of diversity cooling of the electrical equipment with a fan assembly including a first air baffle and a second air baffle disposed within a housing defining a first control compartment and a second control compartment, the air baffles being pivotally operable and a first air moving device and a second air moving device disposed within each of the respective control compartment, the method comprising the steps of:
   receiving a signal responsive to a loss of air pressure from the first air moving device; and
   responsive to receiving the signal, a controller unit operating the second air moving device.

2. A computer implemented method of continuous cooling of the electrical equipment with a fan assembly including a first air baffle and a second air baffle disposed within a housing defining a first control compartment and a second control compartment, the air baffles being pivotally operable and a first air moving device and a second air moving device disposed within each of the respective control compartment, the method comprising the steps of:
   receiving a baffle_absence signal responsive to the movement of the first air baffle from an in_use position; and
   responsive to receiving the baffle_absence signal, a controller unit operating the second air moving device.

3. The method in accordance with claim 2, further comprising the step of receiving a baffle_presence signal responsive to the second air baffle being in a predetermined position.

4. The method in accordance with claim 2, further comprising a step of transmitting an alert signal to a remote computer responsive to the baffle_absence signal.

5. The method in accordance with claim 4, further comprising a step of transmitting an alert signal to a remote computer responsive to the baffle_presence signal.

* * * * *